(12) United States Patent
Wagner et al.

(10) Patent No.: US 10,007,198 B2
(45) Date of Patent: Jun. 26, 2018

(54) METHOD INCLUDING AN ADJUSTMENT OF A PLURALITY OF WAFER HANDLING ELEMENTS, SYSTEM INCLUDING A PLURALITY OF WAFER HANDLING ELEMENTS AND PHOTOLITHOGRAPHY TRACK

(71) Applicant: GLOBALFOUNDRIES Inc., Grand Cayman (KY)

(72) Inventors: Heiko Wagner, Dresden (DE); Sidheswara Mahapatra, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 105 days.

(21) Appl. No.: 15/176,296

(22) Filed: Jun. 8, 2016

(65) Prior Publication Data
US 2017/0084475 A1    Mar. 23, 2017

Related U.S. Application Data

(60) Provisional application No. 62/222,277, filed on Sep. 23, 2015.

(51) Int. Cl.
*G03F 7/20* (2006.01)
*H01L 21/687* (2006.01)
*H01L 21/66* (2006.01)
*H01L 21/67* (2006.01)

(52) U.S. Cl.
CPC ...... *G03F 7/70775* (2013.01); *H01L 21/6715* (2013.01); *H01L 21/67103* (2013.01); *H01L 21/68707* (2013.01); *H01L 21/68742* (2013.01); *H01L 22/12* (2013.01); *H01L 22/20* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,042,623 A | * | 3/2000 | Edwards | ........... H01L 21/67751 29/25.01 |
| 2011/0248190 A1 | * | 10/2011 | Tanaka | .................... H01J 37/20 250/492.21 |

* cited by examiner

*Primary Examiner* — Ratisha Mehta
(74) *Attorney, Agent, or Firm* — Amerson Law Firm, PLLC

(57) ABSTRACT

A method includes providing a semiconductor processing system that includes a plurality of units. Each unit has a configuration that defines a predetermined orientation of a wafer that is provided in the unit and includes a plurality of wafer handling elements. An arrangement of the plurality of wafer handling elements of the unit relative to the predetermined orientation of the wafer is adjustable. For each of the plurality of units, the arrangement of the plurality of wafer handling elements of the unit is adjusted relative to the predetermined orientation of the wafer. For each of the plurality of units, an arrangement of the plurality of wafer handling elements relative to the predetermined orientation of the wafer is provided that is different from the arrangement of the plurality of wafer handling elements relative to the predetermined orientation of the wafer in one or more other units of the plurality of units.

13 Claims, 9 Drawing Sheets

METHOD INCLUDING AN ADJUSTMENT OF A PLURALITY OF WAFER HANDLING ELEMENTS, SYSTEM INCLUDING A PLURALITY OF WAFER HANDLING ELEMENTS AND PHOTOLITHOGRAPHY TRACK

BACKGROUND OF THE INVENTION

1. Field of the Invention

Generally, the present disclosure relates to the field of semiconductor processing, and, in particular, to techniques for the processing of semiconductor wafers wherein wafer handling elements touching wafers are employed.

2. Description of the Related Art

Integrated circuits typically include a large number of circuit elements which include, in particular, field effect transistors. The circuit elements in an integrated circuit may be electrically connected by means of electrically conductive metal lines formed in a dielectric material, for example, by means of damascene techniques. The electrically conductive metal lines may be provided in a plurality of interconnect layers that are stacked on top of each other above a substrate in and on which the circuit elements are formed. Metal lines in different interconnect layers may be electrically connected with each other by means of contact vias that are filled with metal.

For the formation of integrated circuits, techniques of photolithography may be used. For performing photolithography, a layer of a photoresist may be formed on a wafer. This may be done by means of techniques of spin coating. In spin coating, a photoresist solution that includes a photoresist and a solvent may be dispensed to a surface of a wafer that is mounted on a wafer chuck. The photoresist solution may be distributed over the surface of the wafer by rotating the wafer. The wafer may be rotated at a relatively high speed of rotation for an amount of time until a substantial amount of the solvent of the photoresist solution has evaporated and a solid layer of the photoresist remains on the surface of the wafer. In addition to the photoresist layer, other coating layers, such as, for example, optical planarization layers (OLP layers), bottom anti-reflective coatings (BARCs), top anti-reflective coatings (TARCs) and immersion top coats which may be formed over photoresist layers for protecting the photoresist from an immersion fluid used in immersion photolithography and vice versa, may be formed on the wafer, for example, by means of spin coating.

Before the formation of the layer of photoresist, a pre-treatment of the wafer may be performed, which may include a dehydration baking, wherein the wafer is heated to an elevated temperature, and/or a vapor priming, wherein the wafer is exposed to an adhesion promoting agent. The dehydration baking and/or vapor priming may improve an adhesion of the photoresist to the wafer.

After the formation of the layer of photoresist, an edge bead removal process and/or an edge exposure process may be performed for removing relatively thick portions of photoresist (so-called "edge beads") from the edge of the wafer, and a pre-exposure bake wherein the wafer is heated may be performed.

Thereafter, the photoresist may be exposed by projecting a photomask (sometimes also denoted as "reticle") to the layer of photoresist in an exposure tool, for example, in a so-called scanner. In doing so, portions of the photoresist are irradiated with actinic light, i.e., light that induces a chemical reaction in the photoresist by which the solubility of the photoresist in a subsequent development process is substantially changed, for example, ultraviolet light, which is used for projecting the photomask to the photoresist. Other portions of the photoresist are not irradiated, wherein the pattern of irradiated portions of the photoresist depends on a pattern of photomask features provided on the photomask.

Thereafter, a post-exposure bake wherein the wafer is heated may be performed, and the photoresist may be developed to form a photomask. Depending on whether a negative or a positive photoresist is used, and whether a negative or positive development process is used, in the development process, either the non-irradiated portions or the irradiated portions of the photoresist are dissolved in a developer and, thus, are removed from the wafer.

After the formation of the developed photoresist layer, processes for patterning the wafer or modifying the electrical or chemical properties of the wafer may be performed using the portions of the photoresist remaining on the wafer as a photoresist mask. The processes for patterning the wafer may include one or more etch processes, wherein material is removed from portions of the wafer that are not covered by the photoresist mask. Thus, features may be formed on the wafer. The processes for modifying the electrical or chemical properties of the wafer may include one or more ion implantation processes, wherein ions are implanted into portions of the wafer that are not covered by the photoresist mask.

In some applications, several tools used for the above-mentioned wafer processing that is performed before the exposure of the photoresist and tools for the wafer processing that is performed after the exposure of the photoresist may be integrated into larger systems which are called "photolithography tracks." Photolithography tracks may include tools for performing various wafer processing techniques as described above, for example, coating tools, hot plates for performing bake processes wherein the wafer is heated and development tools that are used for supplying a developer solution to the wafers. The term "unit" is often used for a tool included in a photolithography track.

Additionally, photolithography tracks may include equipment for automatically moving wafers within the photolithography tracks. Within the units of a photolithography track, lift pins may be provided for lifting wafers from wafer supports on which the wafers are provided during the processing of the wafers in the tool, and robot arms may be used for transporting the wafers between the units. Typically, robot arms can grip a wafer in a state wherein the wafer has been lifted from the wafer support by means of the lift pins, and they can place wafers on the lift pins before the processing of the wafers.

Photolithography tracks may include up to about 80 units. Process flows performed at wafers in photolithography tracks may include from about 12 process steps to about 25 process steps, wherein up to about 4 units may be provided in parallel for each process step.

Lift pins and/or other wafer handling elements touching wafers that are provided in a photolithography track, such as, for example, robot arms and/or wafer clamps, may cause yield issues, which may include direct yield issues such as scratches formed on a backside of a wafer and implicit yield issues such as a greater likelihood of a formation of defective integrated circuits at a location on a front side of a wafer that is opposite to a location on a backside of the wafer touched by a wafer handling element.

Due to the relatively large number of wafer processing steps performed in a photolithography track, a wafer may be touched by a number of wafer handling elements that are provided in different units of the photolithography track and/or by different robot arms. Therefore, identifying a wafer handling element that causes yield issues and/or identifying a unit of a photolithography track wherein a wafer handling element causing yield issues is located may have issues associated therewith. In particular, identifying a unit causing yield issues that occur only intermittently may be relatively difficult. Known techniques include commonality experiments, wherein the processing of a relatively large number of wafers by a photolithography track is monitored, and correlations between units of the photolithography track and yield issues occurring are identified.

The present disclosure provides methods, systems and photolithography tracks that may help to substantially avoid or at least reduce some or all of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor processing system that includes a plurality of units. Each unit has a configuration that defines a predetermined orientation of a wafer that is provided in the unit. Each unit includes a plurality of wafer handling elements. An arrangement of the plurality of wafer handling elements of the unit relative to the predetermined orientation of the wafer is adjustable. For each of the plurality of units, the arrangement of the plurality of wafer handling elements of the unit relative to the predetermined orientation of the wafer is adjusted. For each of the plurality of units, an arrangement of the plurality of wafer handling elements relative to the predetermined orientation of the wafer is provided that is different from the arrangement of the plurality of wafer handling elements relative to the predetermined orientation of the wafer in one or more other units of the plurality of units.

An illustrative system disclosed herein includes a plurality of units. Each unit includes a wafer support and a plurality of wafer handling elements. The wafer support is configured for receiving a semiconductor wafer, wherein the wafer has a predetermined orientation relative to the wafer support that is defined by a configuration of the unit. Each wafer handling element touches a portion of the wafer that is defined by the predetermined orientation of the wafer relative to the wafer support and a position of the wafer handling element relative to the wafer support. Each of the plurality of units has a different arrangement of the plurality of wafer handling elements of the unit relative to the predetermined orientation of the wafer relative to the wafer support of the unit.

An illustrative photolithography track disclosed herein includes a plurality of units. The one or more units include at least one of a coating unit forming a photoresist coating on a surface of a wafer, a hot plate unit heating the wafer and a developer unit developing the photoresist coating on the surface of the wafer. Each of the plurality of units has a configuration that defines a predetermined orientation of the wafer when the wafer is provided in the unit and includes a plurality of wafer handling elements. An arrangement of the plurality of wafer handling elements relative to the predetermined orientation of the wafer is adjustable.

BRIEF DESCRIPTION OF THE DRAWINGS

The disclosure may be understood by reference to the following description taken in conjunction with the accompanying drawings, in which like reference numerals identify like elements, and in which.

Figure 1:
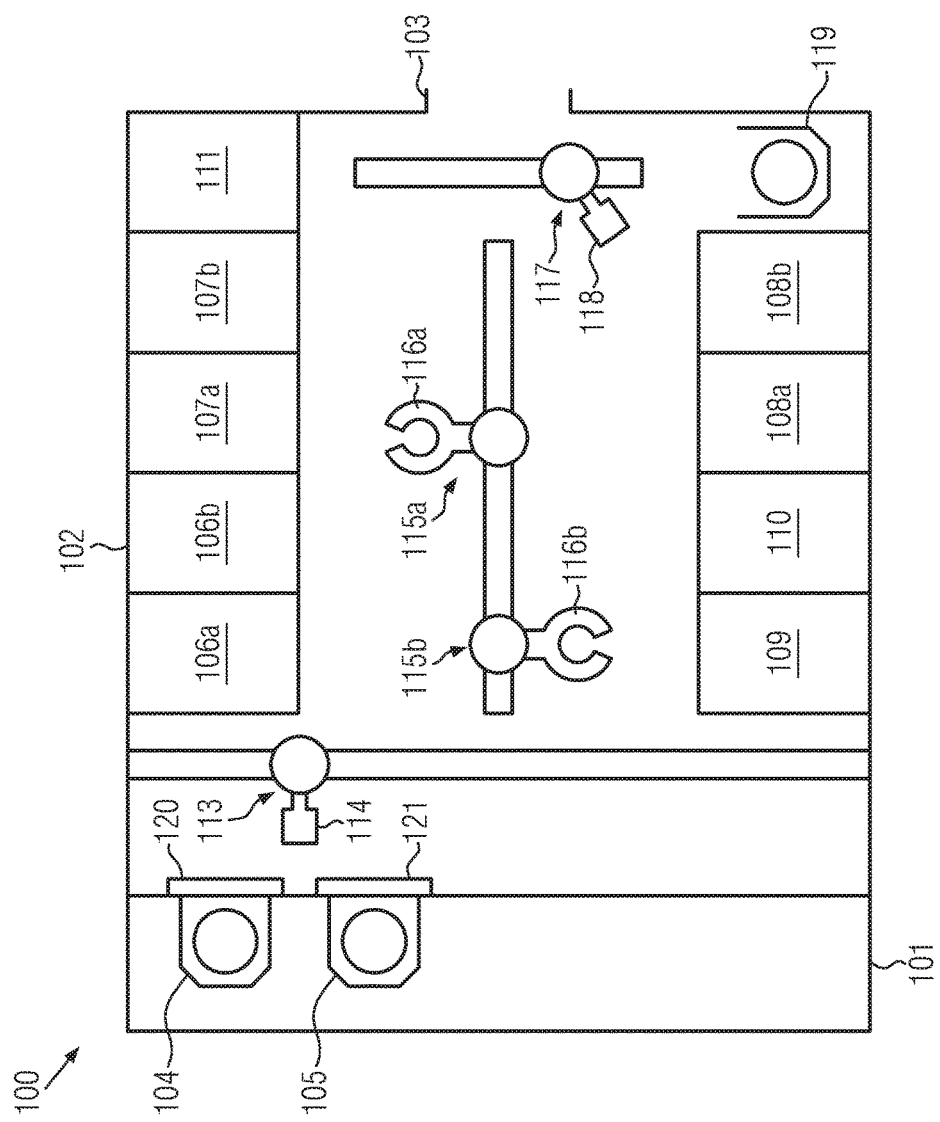
FIG. 1 shows a schematic view of a photolithography track according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, internal process units of a photolithography track, for example, all internal process units of the photolithography track, may be configured such that positions of pins on which the wafers rest such as, for example, lift pins that are employed for lifting a wafer from a wafer support, may be adjusted in position. The adjustability of the pins may include an arrangement angle relative to a notch position of an incoming wafer and/or an arrangement radius. When installing the photolithography track, at each unit, the pins may be rotated slightly relative to the notch position, for example, by an arrangement angle being a multiple of 5 degrees, so that different arrangement angles of the pins are provided in the units. Additionally and/or alternatively, different arrangement radii of the pins may be provided, for example, in units of different types.

When a yield signal is detected that is indicative of a greater likelihood of defects occurring at positions on the wafer corresponding to pin positions (typically three positions at a same radius with 120 degree relative rotation), the unit of the photolithography track that has caused the defects can be pinpointed by measuring the angle between the pin signature on the wafer relative to the notch of the wafer and/or the radius of the pin signature from the center of the wafer.

In some embodiments, a single wafer may be sufficient for pinpointing a unit of a photolithography track that has caused a yield issue. Thus, a quick reaction to the yield issue, such as, for example, a repair and/or an exchange of a unit of a photolithography track, may be performed, and a detection of intermittent yield issues that do not impact every wafer may be simplified. Extensive commonality runs for identifying a unit of a photolithography track causing yield issues need not be performed.

Techniques as disclosed herein may be advantageously employed in photolithography tracks for the processing of relatively large wafers, for example, wafers having a diameter of about 450 mm, since larger wafers can provide a relatively high accuracy of the detection of a correlation between yield issues and pin positions even for relatively weak yield signals. Moreover, more cost savings can be obtained by avoiding running more expensive, larger wafers for experiments performed to pinpoint a unit causing yield issues.

Providing an adjustability of the position of pins can allow ensuring that replacement parts installed in a photolithography track or parts that are exchanged with other photolithography tracks will get a unique signature.

Techniques as disclosed herein can allow an identification of a unit of a photolithography track causing yield issues without requiring extra robot moves or an extra handling time in units of the photolithography track.

The present disclosure is not limited to embodiments wherein positions of pins are adjusted and wherein yield issues caused by pins are identified. Additionally and/or alternatively, techniques disclosed herein may be applied to other wafer handling elements than pins, for example, wafer clamps and/or robot arm fixtures, so that any backside scratches or yield signatures caused implicitly by such mechanical contact points can be pinpointed to a specific unit. Moreover, techniques as disclosed herein are not limited to photolithography tracks. Additionally and/or alternatively, techniques as disclosed herein may be applied to other tools with chambers that include handling hardware touching any side of a wafer, such as pins and/or clamps. Accordingly, the terms "system" and "unit" may include tools other than photolithography tracks, and the term "unit" may include chambers of such tools. Moreover, techniques as disclosed herein may be applied to sorters, wherein each sorter in a fab can have a different signature of a wafer handler. Accordingly, the term "system" may include semiconductor fabs, and the term "unit" may include sorters.

The present disclosure is not limited to embodiments wherein hardware specifically adapted for techniques disclosed herein is provided. In other embodiments, an existing mechanical adjustment range allowing an adjustment of an angle of rotation, a radius and/or a providing of a slight dislocation of wafer handling elements may be used in methods as disclosed herein that may be employed for differentiating units of a system by a wafer handling element location signature.

In some embodiments disclosed herein, the adjustment of the positions of the pins or other wafer handling elements in a unit that touch wafers processed by the unit may be performed during an installation of the unit, and may be maintained for a relatively long time. Alternatively, wafer handling elements of a unit may be movable, for example, by means of actuators, during the operation of a unit in such a manner that positions at which the wafer handling elements touch a wafer change. In particular, units may be adapted to rotate and/or spin wafer handling elements such as, for example, pins. In such embodiments, the adjustment of the positions of the wafer handling elements may include performing a defined movement, for example a rotation, of the wafer handling elements before a wafer is loaded into the unit and/or before the wafer handling elements touch the wafer loaded into the unit. In such embodiments, units provided in a semiconductor processing system such as, for example, a photolithography track that are mechanically substantially identical may still leave an individual signature when they create a yield issue. FIG. 1 shows a schematic view of a photolithography track 100 according to an embodiment, which represents a semiconductor processing system according to an embodiment.

The photolithography track 100 includes a wafer transfer section 101, a wafer processing section 102 and an interface section 103.

The wafer transfer section 101 may include a plurality of gates 120, 121, to which cassettes 104, 105 may be connected. In the cassettes 104, 105, wafers that are to be processed by the photolithography track 100 may be provided to the photolithography track 100, and wafers that have been processed by the photolithography track 100 and/or an exposure system associated with the photolithography track 100 may be inserted into the cassettes 104, 105 for removing the processed wafers from the photolithography track 100. The cassettes 104, 105 may be supplied to the photolithography track 100 and removed from the photolithography track 100 by means of an automated transport system of a semiconductor fab wherein the photolithography track 100 is provided.

The cassettes 104, 105 may be conventional cassettes for the transport of semiconductor wafers, for example, cassettes of a front opening unified pod (FOUP) type.

The interface section 103 may provide an interface between the photolithography track 100 and an exposure system such as, for example, a stepper, wherein photoresist layers that have been formed on surfaces of wafers in the photolithography track 100 are exposed to actinic radiation for forming photoresist masks on the basis of the photoresist layers.

In the wafer processing section 102 of the photolithography track 100, a plurality of units 106a, 106b, 107a, 107b, 108a, 108b, 109, 110, 111 may be provided. Each of the units 106a to 111 may be adapted for performing processing steps related to the formation and development of photoresist layers on wafers and to the formation of other layers used in photolithography, such as optical planarization layers, bottom anti-reflective coatings, top anti-reflective coatings and immersion top coats. The units of the photolithography track 100 may include hot plate units 106a, 106b that may be used for exposing wafers to an elevated temperature, for example, for a dehydration baking of wafers that is performed before the formation of a photoresist layer on a wafer, a pre-exposure bake that is performed after the formation of a photoresist layer on a wafer and before the exposure of the photoresist layer, a post-exposure bake that is performed after the exposure of the photoresist layer on the wafer, and/or a post-development bake that is performed after the development of a photoresist layer on a wafer.

The units of the photolithography track 100 may further include coating units 107a, 107b that may be used for forming a photoresist layer and/or other layers used in photolithography on a wafer, for example, by means of techniques of spin coating. The units of the photolithography track 100 may further include developer units 108a, 108b that may be used for developing a photoresist layer on a wafer after the exposure of the photoresist layer by means of an exposure system associated with the photolithography track 100. In the developer units 108a, 108b, a developer solution may be supplied to a surface of a wafer on which a photoresist layer is provided.

In the processing of a semiconductor wafer by means of the photolithography track 100, the wafer may be processed by one or more of the hot plate units 106a, 106b, one or more of the coating units 107a, 107b, and one of the developer units 108a, 108b.

The units 109, 110, 111 represent units of the photolithography track 100 other than the hot plate units 106a, 106b, the coating units 107a, 107b and the developer units 108a, 108b.

In some embodiments, one of the units 109, 110, 111, for example the unit 109, may be an alignment unit wherein a predetermined orientation of a wafer processed by the photolithography track 100 is provided before the processing of a wafer by means of other units of the photolithography track 100. Furthermore, the units 109, 110, 111 may include one or more cleaning units for performing wafer cleaning processes, one or more edge exposure units for performing an edge exposure process wherein a portion of a photoresist layer at an edge of a wafer is exposed with actinic radiation for removing edge beads from the wafer, one or more vapor priming units and/or one or more measurement units for monitoring processes performed by the photolithography track 100.

The number and arrangement of the units 106a to 111 of the photolithography track 100 illustrated in FIG. 1 is of an exemplary nature only. In some embodiments, a greater or smaller number of units, as well as a different arrangement of units, which may include units stacked on top of each other, may be provided.

The wafer processing section 102 may further include one or more robots 113, 115a, 115b, 117 that may be used for transporting wafers between the cassettes 104, 105, the units 106a to 111, the exposure system associated with the interface section 103 of the photolithography track 100 and/or a buffer stage 119 wherein wafers may be stored between processing steps. Each of the robots 113, 115a, 115b, 117 may include a robot arm. In FIG. 1, reference numeral 114 denotes a robot arm of the robot 113, reference numeral 116a denotes a robot arm of the robot 115a, reference numeral 116b denotes a robot arm of the robot 115b, and reference numeral 118 denotes a robot arm of the robot 117.

Each of the robots 113, 115a, 115b, 117 may be moveable along a rail provided in the photolithography track 100. Furthermore, the robot arms 114, 116a, 116b, 118 may be moveable for handling wafers. In some embodiments, the robot arms 114, 116a, 116b, 118 may include robot arms having different configurations. For example, the robot arms 114, 118 may be specifically adapted for the loading and unloading of wafers from the cassettes 104, 105 and for the transfer of wafers to and from the exposure system 103, respectively, whereas the robot arms 116a, 116b may be specifically adapted for the insertion of wafers into and the removal of wafers from the units 106a to 111.

In the following, the robots 113, 115a, 115b, 117 will sometimes be denoted as "transport units" herein, so that the term "unit" may generally include units 106a to 111 that are employed for the processing of wafers, as well as robots 113, 115a, 115b, 117.

Figure 2:
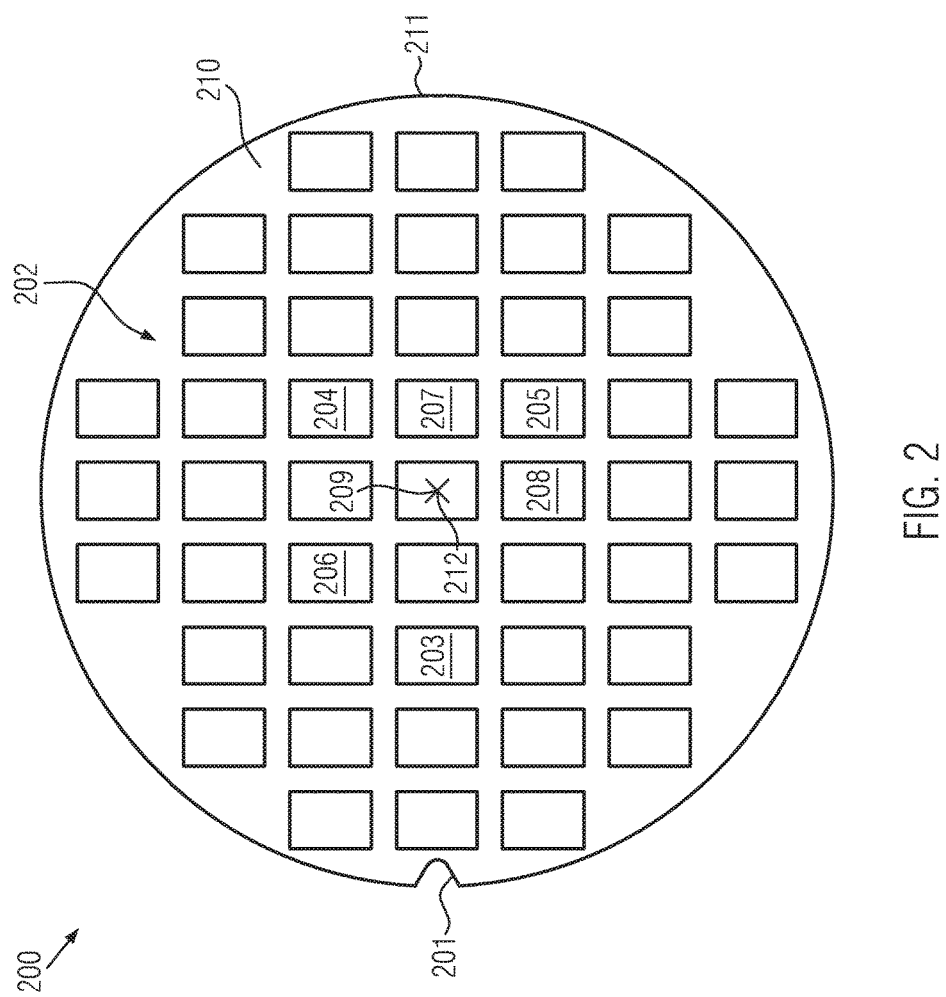
FIG. 2 shows a schematic top view of a wafer that may be processed with the photolithography track illustrated in FIG. 1.

FIG. 2 shows a schematic top view of a wafer 200 that may be processed by means of the photolithography track 100. The wafer 200 may be generally disc-shaped, and it may have a main surface 210 on which a plurality of intra-field areas 202 are provided. In FIG. 2, reference numerals 204 to 208 exemplarily denote some of the intra-field areas 202.

In some embodiments, each of the plurality of intra-field areas 202 may include one or more integrated circuits in a stage of a manufacturing process. In other embodiments, the wafer 200 may be a blank wafer, and one or more integrated circuits may be formed in each of the intra-field areas 202 in a manufacturing process that is carried out on the wafer 200 at a later point in time. The manufacturing process may include process steps that are performed by means of the photolithography track 100.

The main surface 210 of the wafer 200 may be perpendicular to a thickness direction of the wafer 200, wherein an extension of the wafer 200 in any direction other than the thickness direction is greater than the extension of the wafer in the thickness direction. A circumference 211 of the wafer 200 may have a generally circular shape with a center 209. A center axis 212 of the wafer 200 may extend through the center 209, and it may be parallel to the thickness direction.

In some embodiments, the wafer 200 may be a bulk semiconductor wafer that is formed of a substantially monocrystalline semiconductor material, for example, substantially monocrystalline silicon. In other embodiments, the wafer 200 may be a semiconductor-on-insulator wafer that includes a substantially monocrystalline semiconductor layer, for example, a substantially monocrystalline silicon layer, that is provided at the main surface 210 of the wafer 200 and separated from a support wafer portion, which may be formed of silicon, by an electrically insulating layer.

The wafer 200 may further include an alignment feature that denotes a crystal orientation of the substantially monocrystalline semiconductor material of the wafer 200 wherein integrated circuits will be formed. In some embodiments, the alignment feature may be provided in the form of a notch 201. In other embodiments, flats (not shown) may be provided as alignment features of the wafer 200.

In some embodiments, the wafer 200 may have a diameter of about 450 mm.

Figure 3:
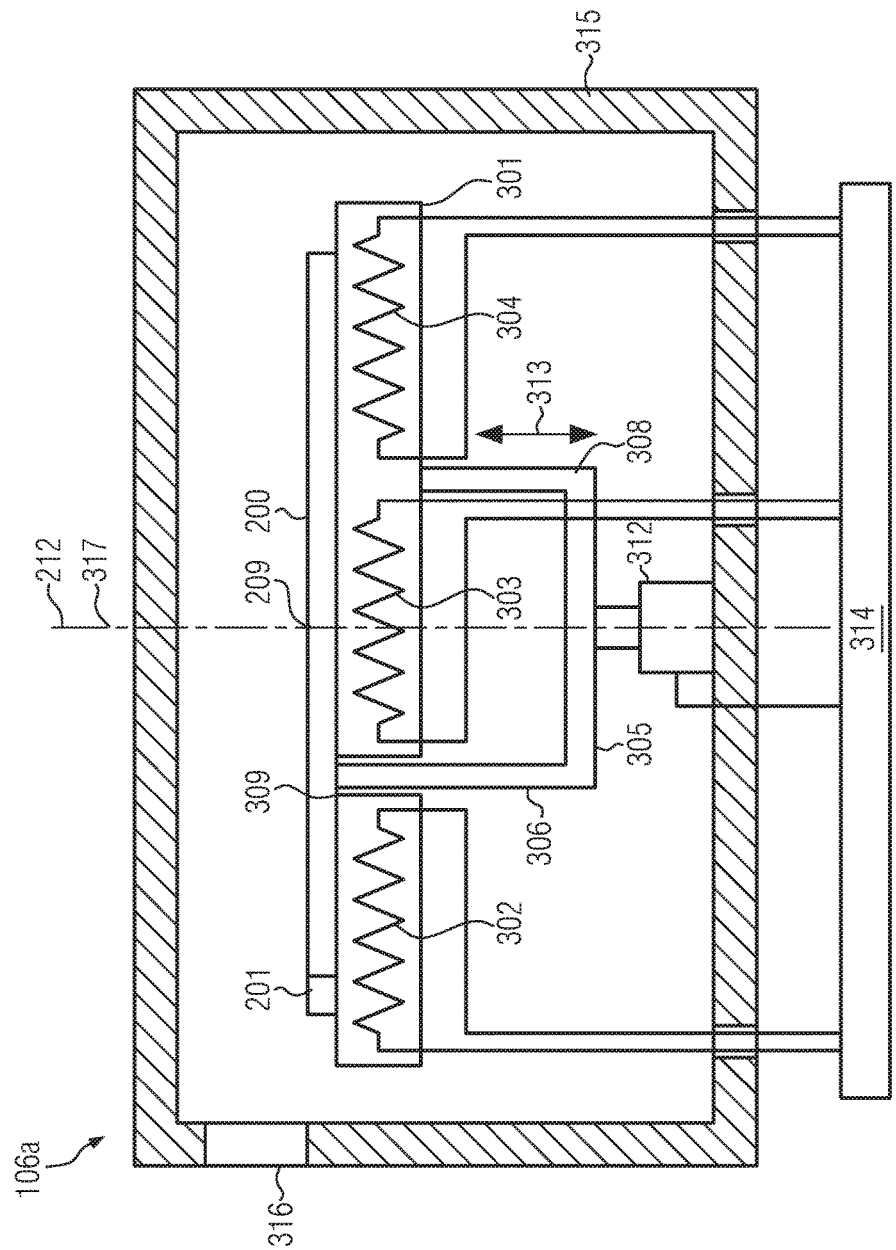
FIG. 3 shows a schematic cross-sectional view of a hot plate unit of the photolithography track illustrated in FIG. 1.
Figure 4:
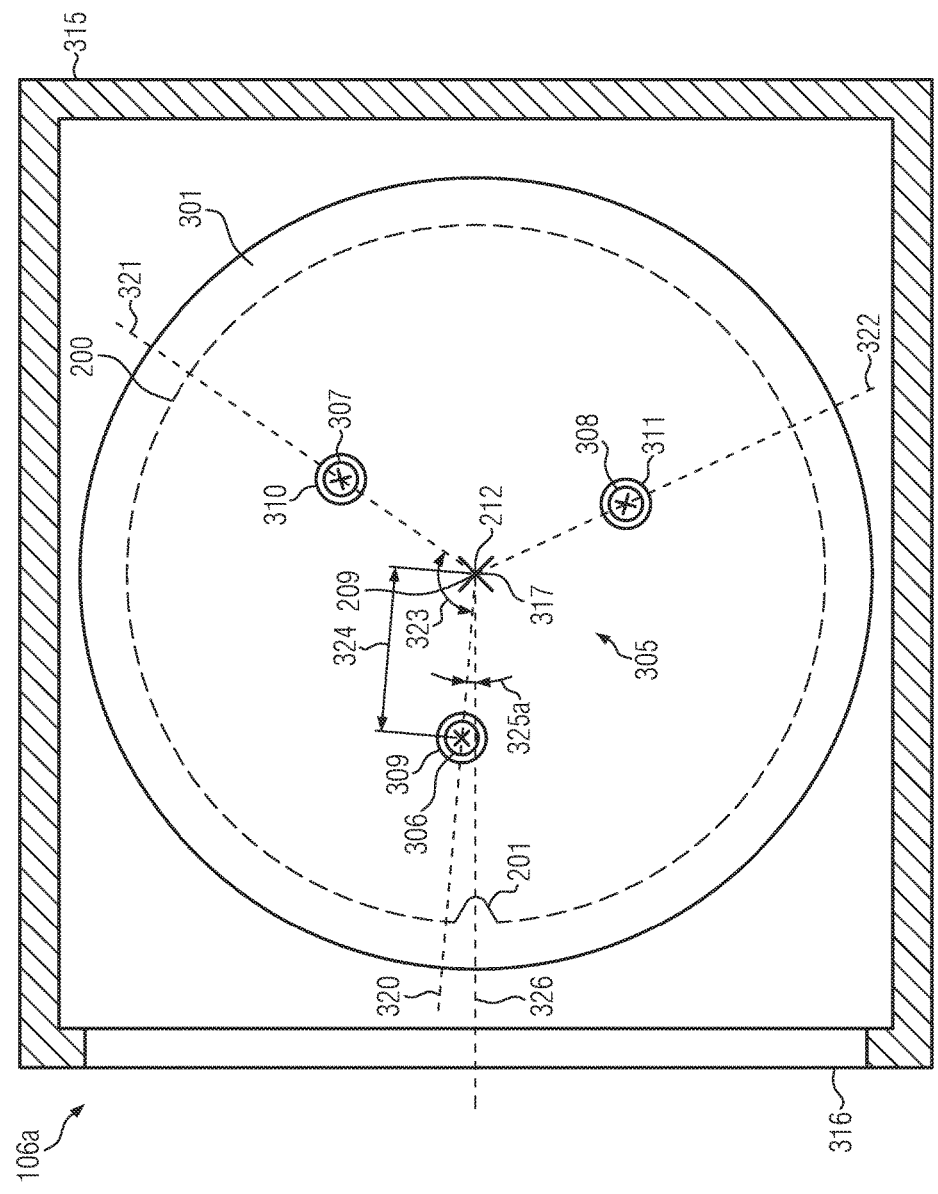
FIGS. 4 and 5 show schematic cross-sectional views of hot plate units in the photolithography track illustrated in FIG. 1.
Figure 5:
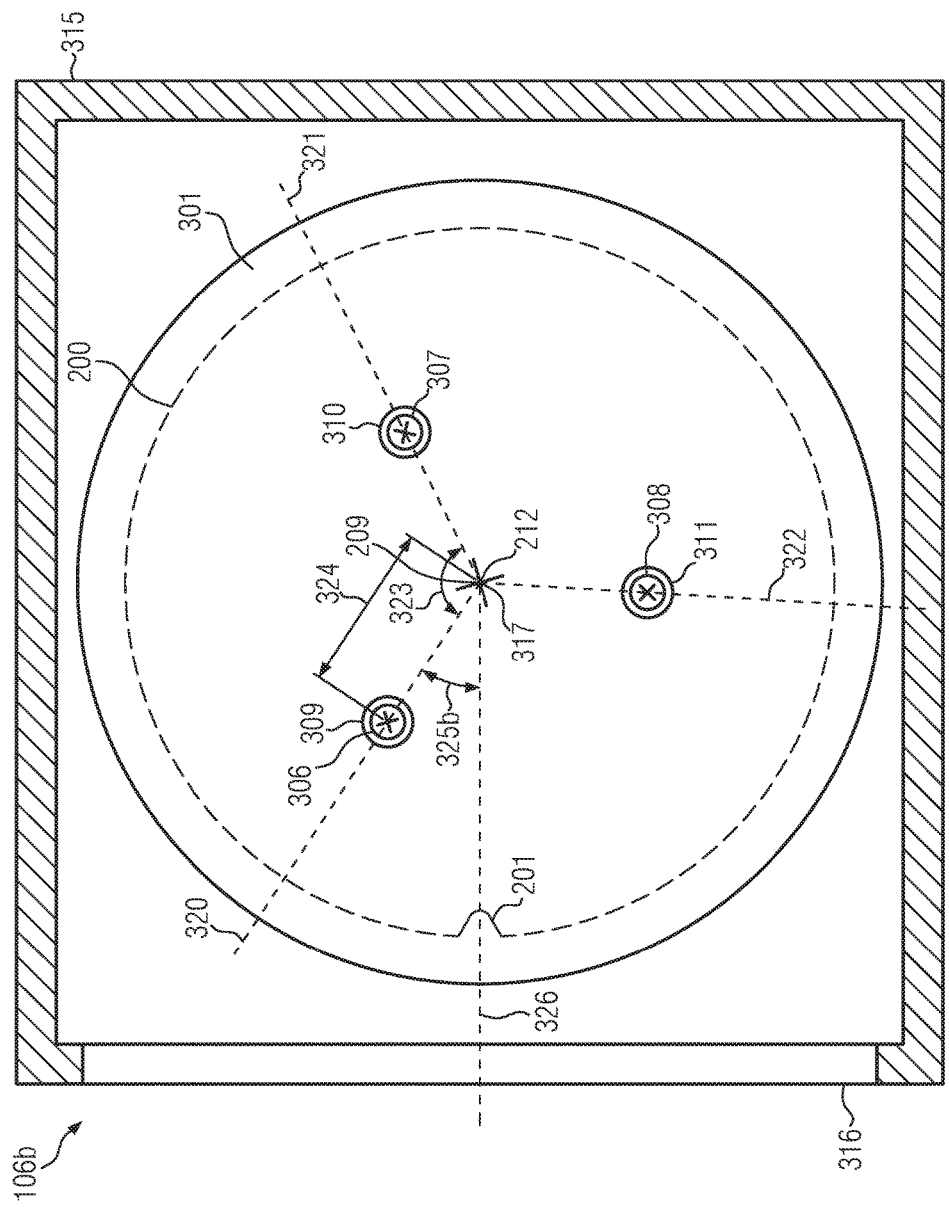

FIG. 3 shows a schematic cross-sectional view of the hot plate unit 106a of the photolithography track 100. A schematic cross-sectional view of the hot plate unit 106a in a direction that is perpendicular to the plane of drawing of FIG. 3 and extends horizontally in the view of FIG. 3 is shown in FIG. 4. The hot plate unit 106b, a schematic cross-sectional view of which is shown in FIG. 5, may be a hot plate unit of the same type as the hot plate unit 106a. Unless explicitly indicated otherwise, features of the hot plate unit 106b may correspond to features of the hot plate unit 106a, and a detailed description thereof will sometimes be omitted.

The hot plate unit 106a may include a hot plate 301, which represents a wafer support of the hot plate unit 106a on which a wafer, such as the wafer 200, is provided when the wafer is processed by means of the hot plate unit 106a. The hot plate 301 may have a disc-shape, having a substantially flat upper surface. When the wafer 200 is provided on the hot plate 301, a backside surface of the wafer 200, being a surface of the wafer 200 that is opposite the main surface 210 may be provided on the upper surface of the hot plate 301 so that the plurality of intra-field areas 202 on the main surface 210 of the wafer 200 are arranged opposite the hot plate 301.

The hot plate 301 may be heated to an elevated temperature, for example, by means of heating elements 302, 303, 304, which may be electrical heating elements that are operated by a control unit 314. When the wafer 200 is provided on the hot plate 301, heat may be transferred from the hot plate 301 to the wafer 200 by heat conduction so that the wafer 200 is heated.

The hot plate 301 may be provided in a housing 315. The housing 315 may be mounted in the photolithography track 100. The housing 315 may include a port 316 through which wafers such as, for example, the wafer 200 may be inserted before the wafer 200 is processed by means of the hot plate unit 106a. After the processing of the wafer 200 by means of the hot plate unit 106a, the wafer 200 may be removed from the hot plate unit 106a through the port 316. In some embodiments, the port 316 may be provided with a closing mechanism so that the port 316 may be closed during the processing of a wafer in the hot plate unit 106a.

The hot plate unit 106a may further include a lifting unit 305. The lifting unit 305 may include a plurality of lift pins 306, 307, 308 and an actuator 312 that is configured for moving the lifting unit 305 parallel to a direction that is substantially perpendicular to the upper surface of the hot plate 301 and the main surface 210 of the wafer 200 provided on the hot plate 301, as schematically illustrated by arrow 313 in FIG. 3. Each of the lift pins 306, 307, 308 is configured to touch the bottom surface of the wafer 200 and represents a wafer handling element of the hot plate unit 106a. The actuator 312 may be configured for moving the lift pins 306, 307, 308 between an upper position and a lower position. In the upper position of the lift pins 306, 307, 308, the tips of the lift pins 306, 307, 308 may be arranged above the upper surface of the hot plate 301 so that the tips of the lift pins 306, 307, 308 protrude from the hot plate 301. In the lower position of the lift pins 306, 307, 308, the tips of the lift pins 306, 307, 308 may be arranged at the level of the upper surface of the hot plate 301, or they may be arranged below the upper surface of the hot plate 301 so that the tips of the lift pins 306, 307, 308 do not protrude from the hot plate 301. The lift pins 306, 307, 308 may extend through openings 309, 310, 311 of the hot plate 301.

For processing the wafer 200 by means of the hot plate unit 106a, the actuator 312 may be operated for moving the lift pins 306, 307 into the upper position wherein they protrude from the surface of the hot plate 301. Then, the wafer 200 may be inserted into the housing 315 of the hot plate unit 106a through the port 316 by means of a robot arm, for example, by means of one of the robot arms 116a, 116b shown in FIG. 1. Then, the robot arm may place the wafer 200 onto the tips of the lift pins 306, 307, 308 that protrude from the upper surface of the hot plate 301. In doing so, the tips of the lift pins 306, 307, 308 touch the bottom surface of the wafer 200.

Thereafter, the robot arm can be removed from the housing 315 of the hot plate unit 106a, and the lift pins 306, 307, 308 may be moved from the upper position to the lower position. Thus, the wafer 200 may be provided on the hot plate 301 so that the bottom surface of the wafer 200 contacts the hot plate 301 and the wafer 200 is heated by the hot plate 301.

After the processing of the wafer 200 by means of hot plate unit 106a, the lift pins 306, 307, 308 may be moved from the lower position to the upper position so that the tips of the lift pins 306, 307, 308 contact the bottom surface of the wafer 200 and move the wafer 200 to a position wherein the wafer 200 is arranged above the upper surface of the hot plate 301, and the bottom surface of the wafer 200 no longer contacts the upper surface of the hot plate 301. Then, the wafer 200 may be removed from the housing 315 of the hot plate unit 106a by means of a robot arm, for example, by means of one of the robot arms 116a, 116b.

The wafer 200 may be provided to the hot plate unit 106a at a predetermined orientation of the wafer 200 relative to the hot plate 301, the lift pins 306, 307, 308 and/or other components of the hot plate unit 106a, such as, for example, the housing 315 and/or the port 316.

The predetermined orientation of the wafer 200 may be defined by the arrangement of the hot plate unit 106a and/or components thereof, such as the hot plate 301 and the lift pins 306, 307, 308 in the photolithography track 100 that is provided when the hot plate unit 106a receives the wafer 200. When the wafer 200 is received by the photolithography track 100, the wafer 200 may be aligned on the basis of an alignment feature such as the notch 201 of the wafer 200 in an alignment unit, for example, the unit 109 provided in the photolithography track 100. Then, the wafer 200 may be moved from the alignment unit 109 to the hot plate unit 106a, for example, by means of one of the robots 115a, 115b, wherein the respective robot can maintain the alignment of the wafer 200 provided by the alignment unit 109. In other embodiments, additionally and/or alternatively, components for providing the predetermined orientation of the wafer 200 may be provided in the hot plate unit 106a.

In the following, the predetermined orientation of the wafer 200 will be described with reference to FIG. 4. For convenience, in FIG. 4, the wafer 200 is shown in a transparent manner so that the lift pins 306, 307, 308 and the openings 309, 310, 311 that are arranged below the wafer 200 are visible. Contours of the wafer 200 are illustrated by dashed lines.

At the predetermined orientation of the wafer 200, the center 209 of the wafer 200 may be provided at a center of the hot plate 301, so that centers of the pins 306, 307, 308, which are illustrated by an "x" in the pins 306, 307, 308 in FIG. 4, are provided at substantially equal distances to the center 209 of the wafer 200 that correspond to an arrangement radius 324. Furthermore, when the wafer 200 is provided at the predetermined orientation, the central axis 212 of the wafer 200 that runs through the center 209 of the wafer 200 and is perpendicular to the main surface 210 of the wafer 200 may substantially coincide with a central axis 317 of the hot plate 301 that runs through a center of the hot plate 301 and is perpendicular to the upper surface of the hot plate 301 on which the wafer 200 is provided for heating the wafer 200 by means of the hot plate unit 106a.

The predetermined orientation of the wafer 200 may further include an alignment of the notch 201 of the wafer 200 so that there is a predetermined orientation of a reference direction 326 from the center 209 of the wafer 200 to the notch 201 of the wafer 200 when the wafer 200 is provided at the predetermined orientation. For example, in some embodiments, the reference direction 326 may extend through the center 209 of the wafer 200 and through a center of the port 316 of the housing 315. In other embodiments, a different arrangement of the reference direction 326 relative to the hot plate unit 106a may be provided.

When a wafer other than the wafer 200 is provided in the hot plate unit 106a, the other wafer may be provided at substantially the same predetermined orientation as the wafer 200, wherein the center of the other wafer and the reference direction of the other wafer that points from the center of the other wafer to the notch of the other wafer are arranged relative to the hot plate unit 106a in the same manner as the center 209 of the wafer 200 and the reference direction 326 pointing from the center 209 of the wafer 200 to the notch 201 of the wafer 200.

The arrangement of the lifting mechanism 305 including the lift pins 306, 307, 308 relative to the predetermined orientation of the wafer 200 and the arrangement of the hot plate 301 relative to the predetermined orientation of the wafer 200 may be adjustable. For adjusting the arrangement of the lift pins 306, 307, 308 relative to the predetermined orientation of the wafer 200, the arrangement of the lift pins 306, 307, 308 may be rotated around the central axis 317 of the hot plate 301. For adjusting the arrangement of the hot plate 301 relative to the predetermined orientation of the wafer 200, the hot plate 301 may be rotated around its central axis 317. The adjustability of the lift pins 306, 307, 308 may be provided by a connection between the lifting mechanism 305 and the housing 315 that allows a mounting of the lifting mechanism 305 at different orientations relative to the housing 315. Additionally, a connection between the hot plate 301 and the housing 315 may allow a mounting of the hot plate 301 at different arrangements relative to the housing 315.

In some embodiments, the adjustment of the arrangement of the lift pins 306, 307, 308 and the adjustment of the hot plate 301 may be performed during an installation of the hot plate unit 106a in the photolithography track 100, and it may remain substantially constant during the processing of a relatively large number of wafers by means of the hot plate unit 106a. In other embodiments, the arrangement of the lift pins 306, 307, 308 relative to the predetermined orientation of the wafer 200 may be adjustable during the operation of the hot plate unit 106a. For example, the actuator 312 of the hot plate unit 106a may be additionally configured to rotate the arrangement of the lift pins 306, 307, 308 around the central axis 317 of the hot plate 301, or an additional actuator (not shown) may be provided for this purpose. In such embodiments, the adjustment of the arrangement of the lift pins 306, 307, 308 may include a defined rotation of the arrangement of the lift pins 306, 307, 308 relative to a rest position that is performed each time before a wafer is processed by the hot plate unit 106a. The defined rotation may be specified in a unit recipe of the hot plate unit 106a which may be executed by the control unit 314.

The arrangement of the lift pins 306, 307, 308 relative to the predetermined orientation of the wafer 200 may define an arrangement angle 325a between the reference direction 326 and a plane 320 that includes the center axis 212 of the wafer 200 and extends through a first one of the lift pins 306, 307, 308, for example through the lift pin 306. The first lift pin 306 may be one of the lift pins 306, 307, 308 that is closest to the notch 201 of the wafer 200 when the wafer 200 is at the predetermined orientation. The plane 320 may be substantially perpendicular to the plane of drawing of FIG. 4, corresponding to the direction of the center axis 212 of the wafer 200, and it may extend through the center of the first lift pin 306. Since the center axis 212 of the wafer 200 at the predetermined orientation of the wafer 200 and the central axis 317 of the hot plate 201 may substantially coincide, the plane 320 may also include the central axis 317 of the hot plate 301. When the arrangement of the lift pins 306, 307, 308 and/or the arrangement of the hot plate 301 relative to the predetermined orientation of the wafer 200 is adjusted, the arrangement angle 325 may be changed. During the processing of a plurality of wafers by means of the hot plate unit 106a, the arrangement angle 325 may be substantially the same for each of the plurality of wafers.

In FIG. 4, reference numeral 321 defines a plane that includes the central axis 212 of the wafer 200 at the predetermined orientation of the wafer 200 and extends through a center of the lift pin 307. Reference numeral 322 denotes a plane that includes the central axis 312 of the wafer 200 at the predetermined orientation of the wafer 200 and extends through the center of the lift pin 308. The lift pins 306, 307, 308 may be arranged at an angle 323 between planes 320, 321, 322 extending through adjacent ones of the lift pins 306, 307, 308 that is approximately equal to 360° divided by the number of lift pins 306, 307, 308. In particular, in embodiments wherein three lift pins 306, 307, 308 are provided, as shown in FIGS. 3 and 4, the angle 323 may be approximately 120° so that the lift pins 306, 307, 308 form an approximately isosceles triangular arrangement.

In FIG. 4, reference numeral 324 denotes an arrangement radius of the first lift pin 306 from the center axis 212 of the wafer 200 at the predetermined orientation of the wafer 200 and from the central axis 317 of the first plate 301. The other lift pins 307, 308 may also be arranged at substantially the arrangement radius 324 from the center axis 212 of the wafer 200 at the predetermined orientation of the wafer 200 and from the central axis 317 of the hot plate 301.

In some embodiments, the arrangement radius 324 of the hot plate unit 106a may be fixed. In other embodiments, the hot plate unit 106a may provide an adjustability of the arrangement radius 324. For this purpose, the lifting mechanism 305 may be configured such that the lift pins 306, 307, 308 may be mounted at different radii. In such embodiments, the hot plate 301 may include a greater number of openings 309, 310, 311, through which the lift pins 306, 307, 308 may alternatively extend, or the openings 309, 310, 311 may have an elongated shape, wherein the direction of elongation of the openings 309, 310, 311 may extend in a radial direction of the hot plate 301.

FIG. 5 shows a schematic cross-sectional view of the hot plate unit 106b that may be provided in the photolithography track 100 in addition to the hot plate unit 106a. The configuration of the hot plate unit 106b may be similar to the configuration of the hot plate 106a. For convenience, in FIG. 5, on the one hand, and in FIGS. 3 and 4, on the other hand, like reference numerals have been used to denote like components. Unless explicitly stated otherwise, components denoted by like reference numerals may have corresponding features, and a detailed description thereof will sometimes be omitted.

Similar to the hot plate unit 106a, the hot plate unit 106b includes a hot plate 301 having openings 309, 310, 311 through which lift pins 306, 307, 308 of a lifting mechanism 305 may be moved in directions of movement that are substantially perpendicular to the plane of drawing of FIG. 5. In addition to the lift pins 306, 307, 308, the lifting mechanism 305 of the hot plate unit 106b may include an actuator similar to the actuator 312 shown in FIG. 3, a control unit similar to the control unit 314 shown in FIG. 3, and heating elements similar to the heating elements 302, 303, 304 shown in FIG. 3.

Planes 320, 321, 322 that include a central axis 212 of a wafer 200 that is provided on the hot plate 301 at a predetermined orientation of the wafer 200 and extends through a respective one of the lift pins 306, 307, 308 may be arranged at an angle 323. In embodiments wherein there are three lift pins 306, 307, 308, the angle 323 may have a value of about 120°.

The plane extending through a first lift pin 306 of the plurality of lift pins 306, 307, 308 may be arranged at an arrangement angle 325b to a reference direction 326 from the center 209 of the wafer 200 to the notch 201 when the wafer 200 is at the predetermined orientation and an arrangement radius 324 from the center axis 212 of the wafer 200.

The arrangement angle 325b and, optionally, an arrangement radius 324 may be adjustable, and they may be adjusted when the hot plate unit 106b is installed in the photolithography track 100.

After the adjustment of the arrangement angles 325a and 325b in the hot plate units 106a, 106b, the arrangement angles 325a, 325b may be different. Additionally and/or alternatively, in embodiments wherein an adjustable arrangement radius of the lift pins 306, 307, 308 is provided, different arrangement radii may be provided in the hot plate units 106a, 106b.

In some embodiments, the arrangement angles 325a, 325b may differ by an arrangement angle difference. The arrangement angle difference may have a value in a range from about 2° to about 118°. For example, the arrangement angle difference may have a value of about 5°.

In some embodiments, one of the arrangement angles 325a, 253b, for example, the arrangement angle 325a, may have a value of about 0°, and the other of the arrangement angles 325a, 325b may have a value of about 5°.

In other units of the photolithography track 100, for example, in the coating units 107a, 107b and/or the developer units 108a, 108b, values of an arrangement angle different from the arrangement angles 325a, 325b provided in the hot plate units 106a, 106b may be provided. In some embodiments, the arrangement angles may have values that are an integer multiple of an arrangement angle difference, wherein the integer multiple is different for at least a part of the units 106a to 111 of the photolithography track 100. For example, arrangement angle values of about 0°, about 5°, about 10°, about 15°, . . . , being integer multiples of an arrangement angle difference of about 5°, may be provided.

Figure 6:
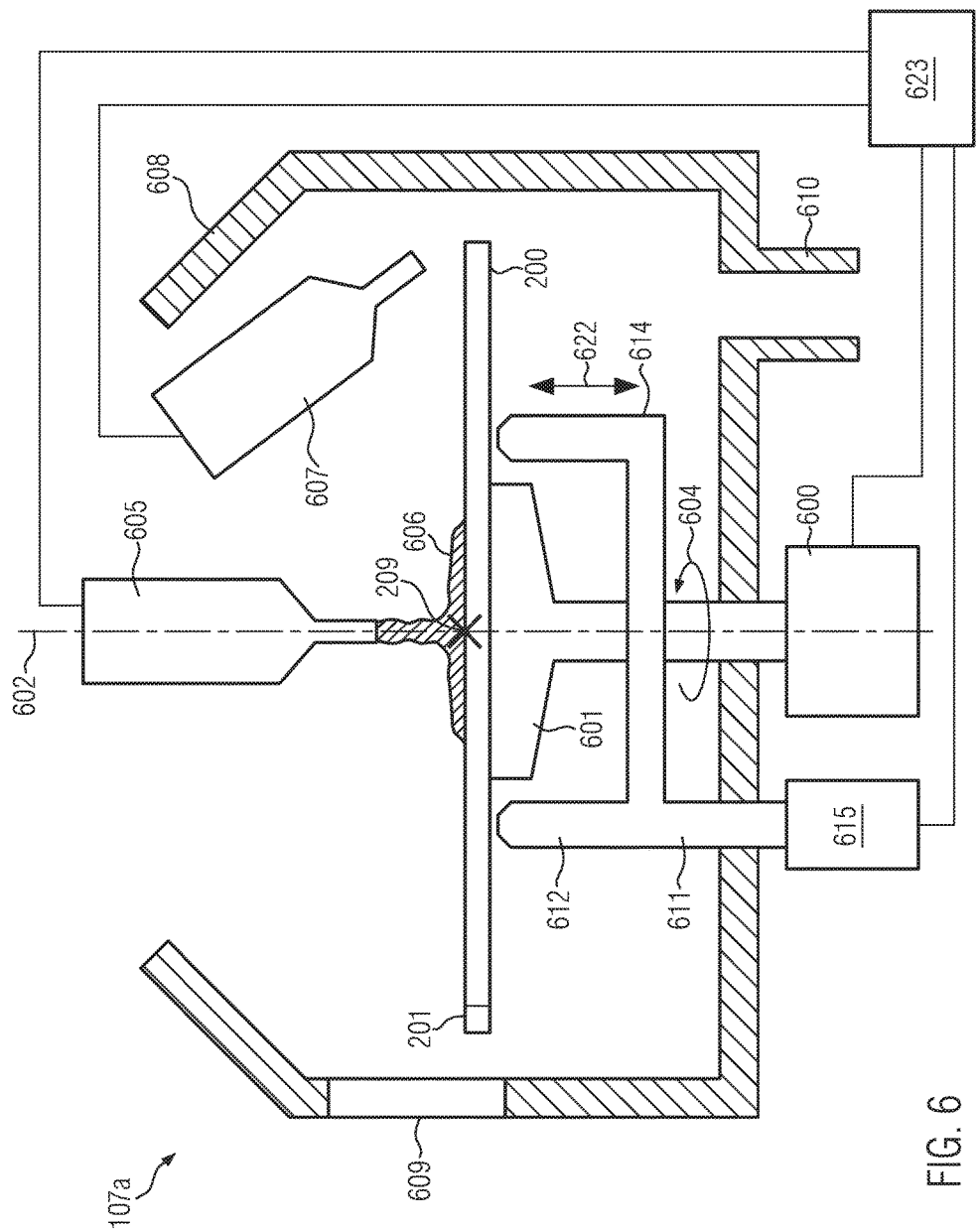
FIG. 6 shows a schematic cross-sectional view of a coating unit in the photolithography track illustrated in FIG. 1.
Figure 7:
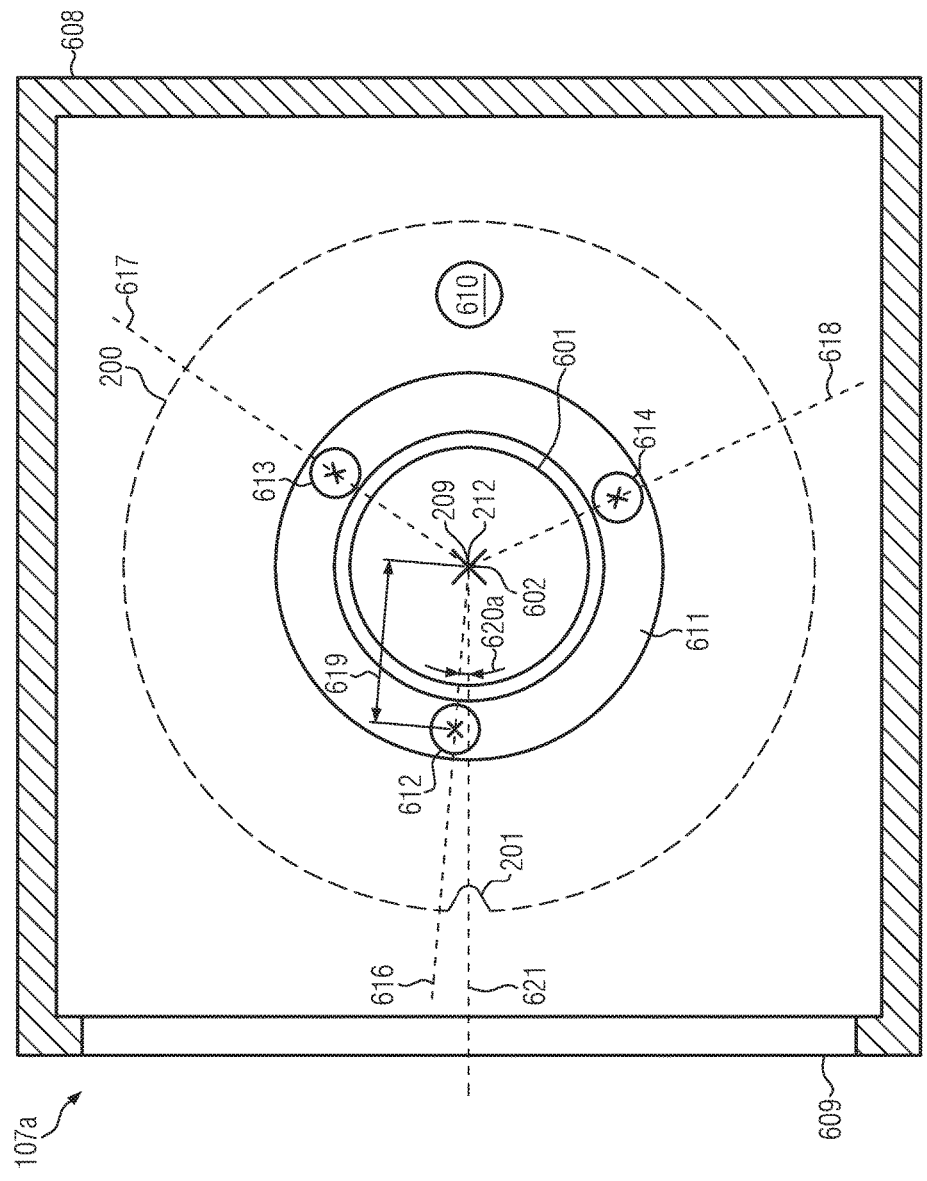
FIGS. 7 and 8 show schematic cross-sectional views of coating units in the photolithography track illustrated in FIG. 1.

FIG. 6 shows a schematic cross-sectional view of the coating unit 107a of the photolithography track 100. A cross-sectional view of the coating unit 107 along a plane that is perpendicular to the plane of drawing of FIG. 6 and horizontal in the view of FIG. 6 is shown in FIG. 7. The coating unit 107a may be a spin-coating tool that may be employed for the formation of a photoresist layer and/or other layers used in photolithography on the surface of a wafer. In the following, the processing of the wafer 200 described above with reference to FIG. 2 by means of the coating unit 107a will be described. Other wafers may be processed in substantially the same manner as the wafer 200, and a detailed description thereof will be omitted.

The coating unit 107a may include a wafer chuck 601 which represents a wafer support, on which the wafer 200 may be provided when the wafer 200 is processed by the coating unit 107a. The wafer chuck 601 may be a vacuum chuck having a substantially flat wafer receiving surface wherein small holes (not shown) connected to a vacuum source (not shown) are provided. When the wafer 200 is processed by the coating unit 107a, the bottom surface of the wafer 200 may be provided on the wafer chuck 601 so that the main surface 210 of the wafer 200 is arranged opposite to the wafer chuck 601. The wafer chuck 601 may be rotated by means of a drive 600 around a central axis 602 of the wafer chuck 601, as illustrated by arrow 604 in FIG. 6. The central axis 602 may be substantially perpendicular to the main surface 210 of the wafer 200 provided on the wafer chuck 601.

The coating unit 107a may further include a fluid dispenser 605 that is operable for dispensing a fluid 606 to the main surface 210 of the wafer 200. The fluid 606 may be a coating solution that includes a solvent and a material of a coating to be formed on the surface of the wafer 200, wherein the material of the coating may be dissolved in the solvent. In some embodiments, the fluid 606 may be a photoresist solution that includes a photoresist and a solvent, and it may be used for coating the main surface 210 of the wafer 200 with a photoresist layer. In other embodiments, the fluid 606 may include a material of a bottom anti-reflective coating, a top anti-reflective coating, an optical planarization layer and/or an immersion top coat.

The coating unit 107a may further include an edge bead removal nozzle 607 that may be connected to a fluid supply, and may be adapted for directing a fluid jet towards an edge area of the wafer. The edge bead removal nozzle 607 may be used for performing a known edge bead removal process after the coating of the wafer 200.

The coating unit 107a may further include a lifting mechanism 611 that includes lift pins 612, 613, 614 and an actuator 615. The actuator 615 may move the lift pins 612, 613, 614 in directions that are substantially perpendicular to the main surface 210 of the wafer 200 provided on the wafer chuck 601, as schematically illustrated by arrow 622 in FIG. 6. In an upper position of the lifting mechanism 611, tips of the lift pins 612, 613, 614 may support the wafer 200 above the wafer chuck 601. In a lower position of the lifting mechanism 611, the tips of the lift pins 612, 613, 614 may be arranged below a top surface of the wafer chuck 601, so that the tips of the lift pins 612, 613, 614 do not touch the bottom surface of the wafer 200 provided on the wafer chuck 601.

The drive 600, the fluid dispenser 605, the edge bead removal nozzle 607 and the actuator 615 may be operated by a control unit 623.

The coating unit 107a may further include a housing 608 having a port 609 through which the wafer 200 may be inserted into the coating unit 107a before the processing of the wafer 200 by the coating unit 107a and removed from the coating unit 107a after the processing of the wafer 200. In the housing, an outlet 610 for portions of the fluid 606 that do not remain on the main surface 210 of the wafer 200 and/or the fluid provided by the edge bead removal nozzle 607 may be formed.

For coating the main surface 210 of the wafer 200 with a material layer such as, for example, a photoresist layer, the actuator 615 of the lifting mechanism 611 may be operated for moving the lift pins 612, 613, 614 into the upper position. Then, the wafer 200 may be placed on tips of the lift pins 612, 613, 614 at a predetermined orientation of the wafer 200 relative to the lift pins 612, 613, 614. This may be done by means of one of the robots 115a, 115b of the photolithography track 100 (see FIG. 1). Similar to the predetermined orientation of the wafer 200 in the hot plate units 106a, 106b described above, the predetermined orientation of the wafer 200 may be defined by a configuration of the coating unit 107a. Techniques for providing the predetermined orientation of the wafer 200 may correspond to those described above in the description of the hot plate units 106a, 106b.

FIG. 7 show a schematic cross-sectional view of the coating unit 107a along a plane that is perpendicular to the plane of drawing of FIG. 6 and horizontal in the view of FIG. 6. For clarity of illustration, the fluid dispenser 605 and the edge bead removal nozzle 607 have been omitted in FIG. 7, and the wafer 200 is shown transparently, the contour of the wafer 200 being shown as a dashed line.

When the wafer 200 is provided at the predetermined orientation, the center axis 212 of the wafer 200 may substantially coincide with the central axis 602 of the wafer chuck 601.

Similar to the hot plate units 106a, 106b, planes 616, 617, 618 that include the center axis 212 of the wafer 200 and the central axis 602 of the wafer chuck 601, and extend through one of the lift pins 612, 613, 614 may be arranged at an angle between adjacent ones of the planes 616, 617, 618 that is approximately equal to 360° divided by the number of lift pins 612, 613, 614. In embodiments wherein there are three lift pins 612, 613, 614, the angle between adjacent ones of the planes 616, 617, 618 may be approximately 120° so that the lift pins 612, 613, 614 have an approximately isosceles triangular arrangement.

The predetermined orientation of the wafer 200 provided in the coating unit 107a may further define a reference direction 621 from the center 209 of the wafer 200 to the notch 201. In some embodiments, the reference direction 621 may extend through a center of the port 609, as shown in FIG. 7. In other embodiments, a different reference direction may be provided wherein, however, the reference direction is substantially the same for all wafers that are processed by the coating unit 107a.

A first lift pin 612 of the lift pins 612, 613, 614, which may be the lift pin that is closest to the notch 201 of the wafer 200 when the wafer 200 is provided at the predetermined orientation, may be arranged such that there is an arrangement angle 620a between the plane 616 through the first lift pin 612. The first lift pin 612, and the other lift pins 613, 614, may be provided at an arrangement radius 619 to the central axis 602 of the wafer chuck 601 and the center axis 212 of the wafer 200 provided thereon.

After placing the wafer 200 on the tips of the lift pins 612, 613, 614, for example, by means of one of the robots 115a, 115b, the actuator 615 may be operated for moving the lifting mechanism 611 into the lower position, so that the wafer 200 rests on the wafer chuck 601. Then, the wafer chuck 601 may be rotated by the drive 600, and the fluid 606 may be dispensed to the main surface 210 of the wafer 200 by the fluid dispenser 605. The fluid 606 may be distributed over the main surface 210 of the wafer 200, so that a coating is formed on the main surface 210 of the wafer 200. Thereafter, an edge bead removal process may be performed by means of the edge bead removal nozzle 607. Then, the wafer 200 may be removed from the coating unit 107a. For this purpose, the actuator 615 of the lifting mechanism 611 may be operated for moving the lift pins 612, 613, 614 into the upper position, so that the wafer 200 is held above the surface of the wafer chuck 601 by the lift pins 612, 613, 614. Then, one of the robots 115a, 115b may be operated for moving the wafer 200 out of the housing 608 of the coating unit 107a.

In some embodiments, the drive 600 may be operated so that an integer number of rotations of the wafer 200 is performed. Thus, after the formation of a coating on the surface of the wafer 200 and/or after the edge bead removal process, the wafer 200 may be provided at the predetermined orientation of the wafer 200 relative to the lift pins 612, 613, 614 again.

The coating unit 107a may be configured such that the arrangement angle 620a and/or the arrangement radius 619 of the lift pins 612, 613, 614 may be adjusted. For this purpose, the coating unit 107a may have mechanical connections for connecting the lifting mechanism 611 to the housing 608 of the coating unit 107a at different positions and/or the lifting mechanism 611 may include connections that allow a different arrangement of the lift pins 612, 613, 614 relative to other portions of the lifting mechanism 611, for example, connections for connecting the lift pins 612, 613, 614 to a base plate of the lifting mechanism 611 on which the lift pins 612, 613, 614 are mounted. In such embodiments, the arrangement angle 620a and/or the arrangement radius 619 may be adjusted during the installation of the coating unit 107a.

In other embodiments, the arrangement angle 620a and/or the arrangement radius 619 may be adjusted by means of one or more actuators provided in the coating unit 107a that are adapted for moving the lift pins 612, 613, 614. For example, the arrangement angle 620a may be adjusted by rotating the arrangement of the lift pins 612, 613, 614 around the central axis 602 of the wafer chuck 601. In such embodiments, the adjustment of the arrangement angle 620a and/or the arrangement radius 619 may be performed by providing a defined motion of the lift pins 612, 613, 614 relative to a rest position before a wafer is loaded into the coating unit 107a. The defined motion may be specified in form of software by means of a unit recipe that is executed by the control unit 623.

In some embodiments, only one of the arrangement angle 620a and the arrangement radius 619 may be adjustable. In particular, in some embodiments, the arrangement radius 619 may be fixed, and the arrangement angle 620a may be adjustable. However, the arrangement radius 619 of the lift pins 612, 613, 614 in the coating unit 107a may be different from the arrangement radius 324 of the lift pins 306, 307, 308 in units of a different type than the coating units 107a, 107b, such as the hot plate units 106a, 106b.

Figure 8:
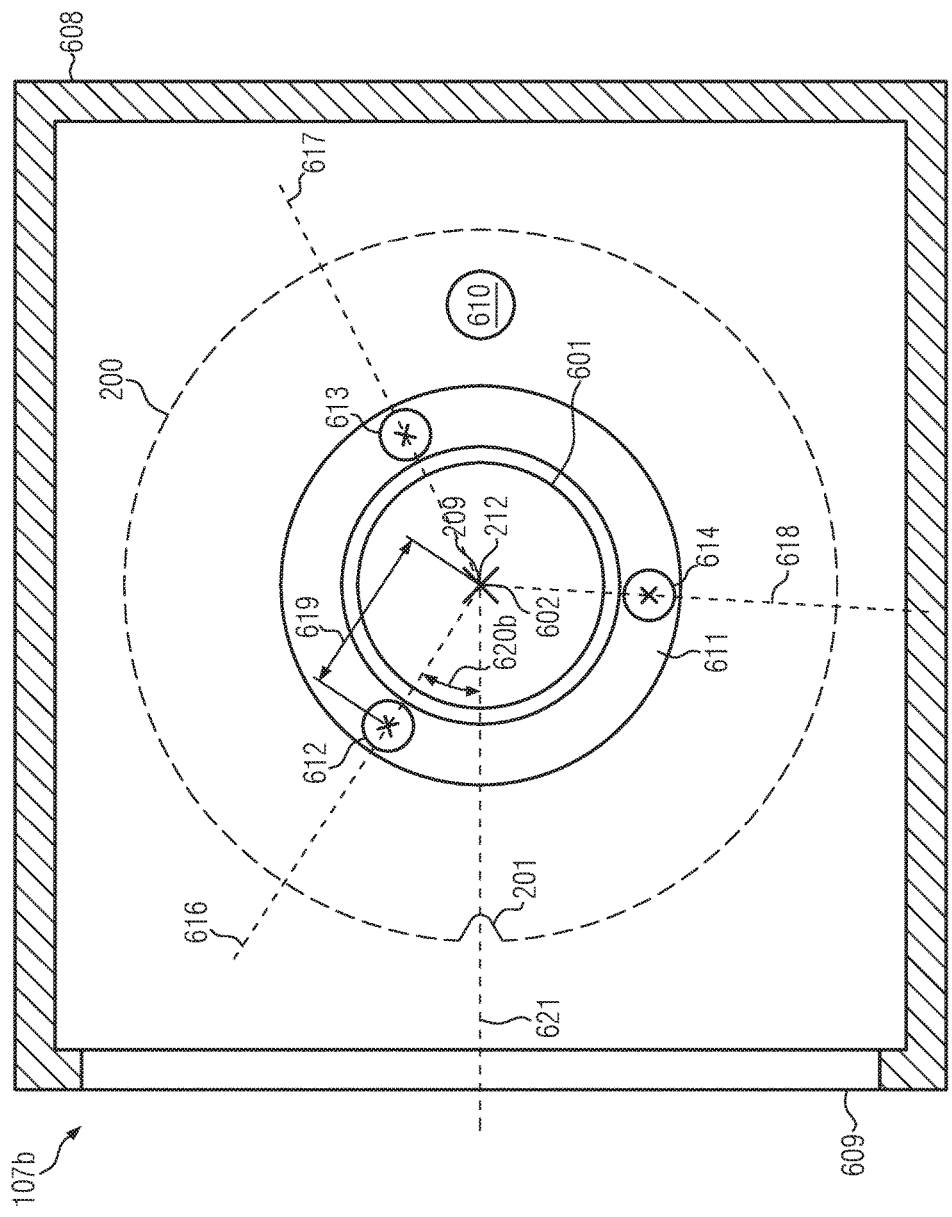

FIG. 8 shows a schematic cross-sectional view of the coating unit 107b. The coating unit 107b may have a configuration corresponding to the configuration of the coating unit 107a. For convenience, in FIGS. 6 and 7, on the one hand, and in FIG. 8, on the other hand, like reference numerals have been used to denote like components. Components denoted by like reference numerals may have corresponding features and a detailed description thereof will sometimes be omitted. Moreover, the coating unit 107b may include features such as the control unit 623, the fluid dispenser 605, the edge bead removal nozzle 607, the drive 600 and the actuator 615 described above with reference to FIG. 6 which are not visible in the view of FIG. 8.

Similar to the coating unit 107a, the coating unit 107b may include a wafer chuck 601 and a lifting mechanism 611 including a plurality of lift pins 612, 613, 614. The lift pins 612, 613, 614 may be arranged such that there are approximately equal angles between adjacent ones of a plurality of planes 616, 617, 618 that each include a central axis 602 of the wafer chuck 601 and extend through a center of a respective one of the lift pins 612, 613, 614. In embodiments wherein there are three lift pins 612, 613, 614 as shown in FIG. 8, the angle between the adjacent ones of the planes 616, 617, 618 may be approximately 120° so that the lift pins 612, 613, 614 form an approximately isosceles triangular arrangement.

The plane 616 extending through a first lift pin 612 of the plurality of lift pins 612, 613, 614 may be arranged at an arrangement angle 620b to a reference direction 621 that extends from the center 209 of the wafer 200 to the notch 201 of the wafer 200 when the wafer 200 is at a predetermined orientation defined by the configuration of the coating unit 107b.

The lift pins 612, 613, 614 may be arranged at an arrangement radius 619 to the central axis 602 of the wafer chuck 601 and the center 209 of the wafer 200.

When the coating units 107a, 107b are installed in the photolithography track 100, or when the lift pins 612, 613, 614 are moved before the processing of a wafer in the respective coating unit 107a, 107b, the thus provided arrangement of the lift pins 612, 613, 614 in each of the coating units may be adapted such that the arrangement angle 620a of the lift pins 612, 613, 614 in the coating unit 107a is different from the arrangement angle 620b of the lift pins 612, 613, 614 in the coating unit 107b. Additionally and/or alternatively, different arrangement radii of the lift pins 612, 613, 614 may be provided in the coating unit 107a and the coating unit 107b, respectively.

Figure 9:
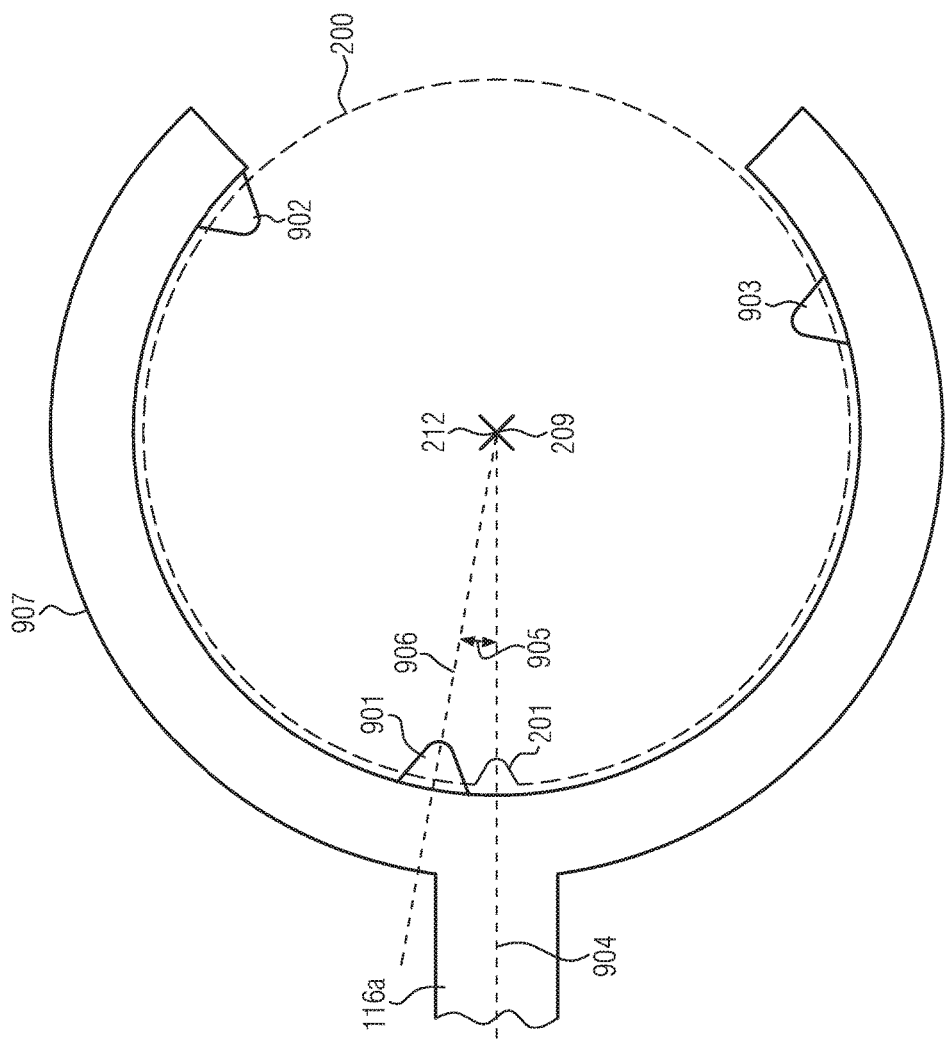
FIG. 9 shows a schematic view of a portion of a robot arm in a wafer transport unit of the photolithography track illustrated in FIG. 1.

FIG. 9 shows a schematic view of a wafer handling portion 907 of the robot arm 116a of the robot 115a that may be used for inserting wafers into the units 106a to 111 of the photolithography track 100 and for removing wafers from the units 106a to 111. The wafer handling portion 907 may have a generally horseshoe shape, and it may include a plurality of protrusions 901, 902, 903, for example three protrusions, on which a wafer, for example, the wafer 200 described above with reference to FIG. 2, may be provided. Similar to the lift pins 306, 307, 308 in the hot plate units 106a, 106b and the lift pins 612, 613, 614 in the coating units 107a, 107b, the protrusions 901, 902, 903 may form a regular polygonal arrangement. In particular, in embodiments wherein there are three protrusions 901, 902, 903 as shown in FIG. 9, the protrusions 901, 902, 903 may form a regular isosceles triangular arrangement.

When the wafer 200 is provided on the wafer handling portion 907 of the robot arm 116a, the wafer 200 may be provided at a predetermined orientation of the wafer 200 relative to the wafer handling portion 907. The predetermined orientation of the wafer 200 may be provided, for example, by means of an alignment unit in the photolithography track 100 and/or by alignment features (not shown) at the wafer handling portion 907 that may engage the notch 201 of the wafer 200.

The predetermined arrangement of the wafer 200 relative to the wafer handling portion 907 defines a reference direction from the center 209 of the wafer 200 to the notch 201 of the wafer 200 when the wafer 200 is at the predetermined orientation. For example, the reference direction 904 may extend along an axis of symmetry of an outer part of the wafer handling portion 907, as shown in FIG. 9. In other embodiments, a different arrangement of the notch 201 may be provided.

In FIG. 9, reference numeral 906 denotes a plane that includes the center axis 212 of the wafer 200 and extends through a first protrusion 901 of the plurality of protrusions 901, 902, 903. The plane 906 may be arranged at an arrangement angle 905 to the reference direction 904.

The arrangement angle 905 may be adjustable. For example, in some embodiments, the protrusions 901, 902, 903 may be provided on a component that may be fixed to the outer part of the wafer handling portion 907 in different positions.

The robot arm 116b of the robot 115b may include a wafer handling portion similar to the wafer handling portion 907 of the robot arm 116a shown in FIG. 9 wherein, however, the arrangement of the protrusions 901, 902, 903 may be adjusted such that a different arrangement angle 905 of the protrusions 901, 902, 903 is provided, for example, when the robot arms 116a, 116b are installed in the photolithography track 100.

When the units 106a to 111 of the photolithography track 100 are installed, in some or all of the units 106a to 111 and/or the robots 115a, 115b, wafer handling elements, such as lift pins (in particular, the lift pins 306, 307, 308 in the hot plate units 106a, 106b and the lift pins 612, 613, 614 in the coating units 107a, 107b) and protrusions at the wafer handling portions of robot arms (in particular, protrusions 901, 902, 903 provided at wafer handling portions of the robot arms 116a, 116b) may be adjusted such that a different arrangement of the wafer handling elements relative to a predetermined orientation of a wafer provided in the respective unit is obtained in some or all of the units 106a to 111 and/or the robots 115a, 115b. The arrangements of the wafer handling elements may differ, in particular, in an arrangement angle and/or an arrangement radius of the wafer handling elements.

The present disclosure is not limited to embodiments wherein the wafer handling elements are lift pins or protrusions of wafer handling portions of robot arms. In other embodiments, the wafer handling elements may be wafer clamps.

The different arrangements of wafer handling elements relative to a predetermined orientation of a wafer in the units 106a to 111 of the photolithography track 100 may be used for identifying a unit of the photolithography track 100 that causes a yield issue when wafers are processed by the photolithography track 100. As already mentioned above, such yield issues may include direct yield issues such as, for example, backside scratches caused by the wafer handling elements of the unit, or implicit yield issues, wherein integrated circuits formed on a wafer processed by the photolithography track 100 that are located opposite portions of the bottom surface of the wafer 200 that are touched by the wafer handling elements have a greater likelihood of defective integrated circuits occurring.

When a wafer, such as, for example, the wafer 200 described above with reference to FIG. 2 is processed by the photolithography track 100, the wafer 200 may be sequentially processed by at least a part of the units 106a to 111. For example, one of the hot plate units 106a, 106b may be employed for performing a pre-bake of the wafer 200. Thereafter, one or more coatings that include a photoresist coating may be formed on the wafer 200 using one or both of the coating units 107a, 107b. For example, one of the coating units 107a, 107b, for example, the coating unit 107a, may be used for forming a bottom anti-reflective coating, and the other of the coating units 107a, 107b, for example, the coating unit 107b, may be used for forming a photoresist layer on the bottom anti-reflective coating. Thereafter, an edge exposure process may be performed, for example, by means of unit 111, and the photoresist may be exposed by an exposure system such as, for example, a stepper associated with the interface section 103 of the photolithography track 100. Thereafter, a photoresist development process may be performed using one of the developer units 108a, 108b. Between the processing steps, one or both of the robots 115a, 115b may be used for moving the wafer 200.

Due to the different arrangement of the wafer handling elements in the units 106a to 111 and/or the robots 115a, 115b of the photolithography track 100, the wafer handling elements can touch different portions of the wafer 200. For example, lift pins that are arranged at a relatively small arrangement angle can touch portions of the bottom surface of the wafer 200 below intra-field areas 203, 204, 205. Lift pins arranged at a greater arrangement angle can touch portions of the bottom surface of the wafer 200 below intra-field areas 206, 207, 208.

After the processing of the wafer 200 by means of the photolithography track 100, and/or after further processing steps performed by means of other systems in a semiconductor manufacturing fab, an inspection of the wafer 200 may be performed. In the inspection of the wafer, it can be determined if the wafer 200 has a defect that is related to the touching of the wafer by wafer handling elements such as lift pins, protrusions of robot arms and/or wafer clamps. If a defect of the wafer is detected, this can be indicated by a detection of a yield signal, and it can be determined if positions of the defects of the wafer 200 match the arrangement of the wafer handling elements in one of the units 106a to 111 and/or the robots 115a, 115b of the photolithography track 100. For example, defects occurring in intra-field areas 203, 204, 205 can be indicative of problems caused by wafer handling elements arranged at relatively small arrangement angles and defects occurring in intra-field areas 206, 207, 208 can be indicative of problems caused by wafer handling elements arranged at a greater arrangement angle. Similarly, wafer handling elements provided at different arrangement radii can cause defects in infra-field areas of the plurality of intra-field areas 202 that are arranged at different distances from the center 209 of the wafer 200.

If there is a match between the position of a defect on the wafer 200 and the arrangement of the wafer handling elements in one of the units 106a to 111 of the photolithography track 100, the respective unit can be identified as the unit that has caused the defect.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
providing a semiconductor processing system comprising a plurality of units, each unit having a configuration that defines a predetermined orientation of a wafer provided in the unit, each unit comprising a plurality of wafer handling elements, an arrangement of the plurality of wafer handling elements of the unit relative to the predetermined orientation of the wafer being adjustable; and
for each of the plurality of units, adjusting the arrangement of the plurality of wafer handling elements of the unit relative to the predetermined orientation of the wafer, wherein, for each of the plurality of units, an arrangement of the plurality of wafer handling elements relative to the predetermined orientation of the wafer is provided that is different from the arrangement of the plurality of wafer handling elements relative to the predetermined orientation of the wafer in one or more other units of the plurality of units.

2. The method of claim 1, further comprising:
processing a semiconductor wafer, the processing of the semiconductor wafer comprising, for each of at least a subset of the plurality of units of the system, handling the wafer with the plurality of wafer handling elements of the unit wherein the wafer has the predetermined orientation defined by the configuration of the unit, the handling of the wafer comprising touching the wafer with the plurality of wafer handling elements of the unit;
determining if the wafer has at least one defect that is related to the touching of the wafer; and
if the wafer has at least one defect, identifying one of the plurality of units that has caused the at least one defect on the basis of a match between a position of the at least one defect on the wafer and the arrangement of the plurality of wafer handling elements of the one of the plurality of units provided in the adjustment of the arrangement of the plurality of wafer handling elements.

3. The method of claim 2, wherein:
the predetermined orientation of the wafer defined by the configuration of the unit defines a center axis running through a center of the wafer and being perpendicular to a main surface of the wafer and a reference direction from the center of the wafer to an alignment feature of the wafer;
wherein, for each of the plurality of units, the arrangement of the plurality of wafer handling elements provided by the adjustment of the plurality of wafer handling elements defines an arrangement angle between the reference direction and a plane including the center axis and extending through a first wafer handling element of the plurality of wafer handling elements of the unit and an arrangement radius of the first wafer handling element from the center axis; and
wherein the arrangement of the plurality of wafer handling elements in the plurality of units differs by at least one of a different arrangement angle and a different arrangement radius.

4. The method of claim 3, wherein the alignment feature of the wafer comprises a notch.

5. The method of claim 4, wherein, for at least a subset of the plurality of units, the arrangement angle is approximately equal to a product of an integer number and a predetermined arrangement angle difference, the integer number being different for each unit of the subset of the plurality of units.

6. The method of claim 4, wherein the plurality of units comprises a first unit of a first type and a second unit of a second type, and wherein the arrangement of the plurality of wafer handling elements in the first unit and the arrangement of the plurality of wafer handling elements in the second unit define different arrangement radii.

7. The method of claim 4, wherein the semiconductor system comprises a photolithography track, and wherein each of the plurality of wafer handling elements comprises a pin.

8. The method of claim 7, wherein, for one or more of the plurality of units, the plurality of wafer handling elements is formed by three pins forming approximately an isosceles triangular pin arrangement.

9. The method of claim 8, wherein the determining if the wafer has at least one defect that is related to the touching of the wafer comprises detecting a yield signal indicative of a greater likelihood of defective integrated circuits occurring at positions on the wafer having an isosceles triangular arrangement.

10. The method of claim 9, wherein one or more of the units further comprises a wafer support receiving the wafer, wherein the predetermined orientation of the wafer is an orientation of the wafer when the wafer is provided on the wafer support.

11. The method of claim 4, wherein, for at least one of the plurality of units, the plurality of wafer handling elements are provided at a robot arm.

12. The method of claim 1, wherein, for each of the plurality of units, the adjustment of the arrangement of the plurality of wafer handling elements is performed during an installation of the unit in the semiconductor processing system.

13. The method of claim 1, further comprising processing a plurality of wafers, the processing of each of the plurality of wafers comprising, for each of at least a subset of the plurality of units of the system, touching the wafer with the plurality of wafer handling elements of the unit, wherein, for each of the plurality of units, the adjustment of the arrangement of the plurality of wafer handling elements of the unit comprises performing a predetermined movement of the plurality of wafer handling elements before one of the plurality of wafers is touched with the plurality of wafer handling elements of the unit, wherein the predetermined movement of the plurality of wafer handling elements defines the arrangement of the plurality of wafer handling elements of the unit relative to the predetermined orientation of the wafer.

* * * * *